United States Patent
Casale et al.

(10) Patent No.: US 10,268,202 B1
(45) Date of Patent: Apr. 23, 2019

(54) AUTOMATED CONSTRUCTION SCRIBING DEVICES AND METHODS OF USE

(71) Applicant: DPR Construction, Redwood City, CA (US)

(72) Inventors: Daniel Lawrence Casale, Vero Beach, FL (US); Jeremy Bartle, Redwood City, CA (US)

(73) Assignee: DPR Construction, Redwood City, CA (US)

( * ) Notice: Subject to any disclaimer, the term of this patent is extended or adjusted under 35 U.S.C. 154(b) by 39 days.

(21) Appl. No.: 14/673,665

(22) Filed: Mar. 30, 2015

(51) Int. Cl.
| | |
|---|---|
| *E01C 23/07* | (2006.01) |
| *G05D 1/02* | (2006.01) |
| *B25H 7/04* | (2006.01) |
| *G06F 17/50* | (2006.01) |

(52) U.S. Cl.
CPC ............ *G05D 1/0231* (2013.01); *B25H 7/04* (2013.01); *G06F 17/5004* (2013.01); *Y10S 901/43* (2013.01)

(58) Field of Classification Search
CPC ................................ G05D 1/0231; B25H 7/04
See application file for complete search history.

(56) References Cited

U.S. PATENT DOCUMENTS

| | | | | | |
|---|---|---|---|---|---|
| 5,453,931 | A * | 9/1995 | Watts, Jr. | ............. | G05D 1/0231 180/168 |
| 6,064,940 | A * | 5/2000 | Rodgers | ................ | G01C 15/02 342/450 |
| 6,330,503 | B1 * | 12/2001 | Sharp | .................... | E01C 23/163 173/1 |
| 6,588,868 | B1 * | 7/2003 | Skultety-Betz | ...... | G01C 15/004 33/293 |
| 7,372,247 | B1 * | 5/2008 | Giusti | .................... | G01V 15/00 324/326 |
| 8,555,461 | B2 * | 10/2013 | Hachtmann | ........... | B66B 31/003 15/320 |
| 2007/0059098 | A1 * | 3/2007 | Mayfield | ................ | A63C 19/06 404/84.5 |
| 2008/0046221 | A1 * | 2/2008 | Stathis | ................. | G01C 15/002 703/1 |
| 2009/0231582 | A1 * | 9/2009 | Aebischer | ............ | G01C 15/002 356/364 |
| 2011/0043515 | A1 * | 2/2011 | Stathis | ................. | G01C 15/002 345/419 |
| 2014/0277728 | A1 * | 9/2014 | Miller | .................... | B25J 9/1684 700/258 |
| 2015/0285644 | A1 * | 10/2015 | Pfaff | ..................... | G05D 1/0217 701/25 |

* cited by examiner

*Primary Examiner* — Jess Whittington
(74) *Attorney, Agent, or Firm* — Carr & Ferrell LLP

(57) ABSTRACT

Construction design layout devices and systems are provided herein. An example device includes a chassis configured to translate along a floor, an optical prism mounted to the chassis that reflects signals from a base station, a marking assembly mounted to the chassis, the marking assembly having at least a marking device that physically marks the floor, and a controller configured to receive construction instructions comprising floor markings defined by floor coordinates, translate the chassis along the floor in alignment with the floor coordinates, and transfer the floor markings to the floor during translation using the marking assembly.

19 Claims, 14 Drawing Sheets

FIG. 7

| feet x | y | center & (left ‖ both) | center & (right ‖ both) | inside(1)/ Outside(2)/ neither(0) | solid(1)/dash(2)/ Partialdash(3)/ none(0) | wall width | Forward/ Reverse | StartDoor inkJet: Inside(1)/ outside(2)/neither(0) | EndDoor inkJet: Inside(1)/ outside(2)/neither(0) |
|---|---|---|---|---|---|---|---|---|---|
| 97.2103 | -28.50354 | 0 | 0 | 0 | 0 | 0.5 | 1 | 1 | 1 |
| 97.2103 | -36.87854 | 0 | 0 | 0 | 0 | 0.5 | 1 | 0 | 0 |
| 97.36134 | -36.74312 | 0 | 0 | 0 | 0 | 0.5 | 1 | 1 | 1 |
| 84.65301 | -36.74312 | 0 | 0 | 0 | 0 | 0.5 | 1 | 0 | 0 |
| 84.80405 | -36.87854 | 0 | 0 | 0 | 0 | 0.5 | 1 | 1 | 1 |
| 84.80405 | -28.50354 | 0 | 0 | 0 | 0 | 0.5 | 1 | 0 | 0 |
| 84.80405 | -28.20145 | 0 | 0 | 0 | 0 | 0.5 | 1 | 1 | 1 |
| 84.80405 | -19.82645 | 0 | 0 | 0 | 0 | 0.5 | 1 | 0 | 0 |
| 84.65301 | -19.96187 | 0 | 0 | 0 | 0 | 0.5 | 1 | 1 | 1 |
| 97.36134 | -19.96187 | 0 | 0 | 0 | 0 | 0.5 | 1 | 0 | 0 |
| 97.2103 | -19.82645 | 0 | 0 | 0 | 0 | 0.5 | 1 | 1 | 1 |
| 97.2103 | -28.20145 | 0 | 0 | 0 | 0 | 0.5 | 1 | 0 | 0 |
| 97.36134 | -28.3525 | 0 | 0 | 0 | 0 | 0.5 | 1 | 1 | 1 |
| 84.65301 | -28.3525 | 0 | 0 | 0 | 0 | 0.5 | 1 | 0 | 0 |
| 84.65301 | 13.2045 | 0 | 0 | 0 | 0 | 0.5 | 1 | 1 | 1 |
| 97.36134 | 13.2045 | 0 | 0 | 0 | 0 | 0.5 | 1 | 0 | 0 |
| 84.80405 | 4.62637 | 0 | 0 | 0 | 0 | 0.5 | 1 | 1 | 1 |
| 84.60092 | 4.81387 | 0 | 0 | 0 | 0 | 0.5 | 1 | 0 | 0 |
| 97.36134 | 4.81387 | 0 | 0 | 0 | 0 | 0.5 | 1 | 1 | 1 |
| 97.2103 | 4.67845 | 0 | 0 | 0 | 0 | 0.5 | 1 | 0 | 0 |
| 97.2103 | 13.05345 | 0 | 0 | 0 | 0 | 0.5 | 1 | 1 | 1 |
| 97.36134 | 13.35316 | 0 | 0 | 0 | 0 | 0.5 | 1 | 0 | 0 |
| 97.2103 | 21.73054 | 0 | 0 | 0 | 0 | 0.5 | 1 | 1 | 1 |
| 97.36134 | 21.59512 | 0 | 0 | 0 | 0 | 0.5 | 1 | 0 | 0 |
| 84.65301 | 21.59512 | 0 | 0 | 0 | 0 | 0.5 | 1 | 1 | 1 |
| 84.80405 | 21.73054 | 0 | 0 | 0 | 0 | 0.5 | 1 | 0 | 0 |
| 84.80405 | 13.35554 | 0 | 0 | 0 | 0 | 0.5 | 1 | 0 | 0 |

700

AUTOMATED CONSTRUCTION SCRIBING DEVICES AND METHODS OF USE

FIELD OF THE INVENTION

The present technology pertains to construction planning, and more specifically, but not by limitation, to devices and systems that can be used to automatically transfer two-dimensional construction models or other instructions onto surfaces or other substrates such as floors.

SUMMARY

According to some embodiments, the present technology is directed to a device, comprising: (a) a chassis configured to translate along a floor; (b) an optical prism mounted to the chassis that reflects signals from a base station; (c) a marking assembly mounted to the chassis, the marking assembly comprising at least a marking device that marks the floor; and (d) a controller configured to: (i) receive construction instructions comprising floor markings defined by floor coordinates; (ii) translate the chassis along the floor in alignment with the floor coordinates; and (iii) transfer the floor markings to the floor during translation using the marking assembly.

According to some embodiments, the present technology is directed to a system, comprising: (a) a base station transmitting signals to a construction marking device; and (b) a construction marking device, comprising: (i) a chassis configured to translate along a floor; (ii) an optical prism mounted to the chassis that reflects signals from a base station; (iii) a marking assembly mounted to the chassis, the marking assembly comprising at least a marking device that marks the floor; and (iv) a controller configured to: (1) receive construction instructions comprising floor markings defined by floor coordinates; (2) translate the chassis along the floor in alignment with the floor coordinates using distance measurement signals received from the base station; and (3) transfer the floor markings to the floor during translation using the marking assembly.

According to some embodiments, the present technology is directed to a device, comprising: (a) a chassis configured to translate along a floor; (b) a motion sensing assembly that senses movement or direction of movement of the device; (c) a marking assembly mounted to the chassis, the marking assembly comprising at least a marking device that marks the floor; and (d) a controller configured to: (i) receive construction instructions comprising floor markings defined by floor coordinates; (ii) translate the chassis along the floor in alignment with the floor coordinates using a current location of the device, motion input from the motion sensing assembly, and the floor coordinates; and (iii) transfer the floor markings to the floor during translation using the marking assembly.

BRIEF DESCRIPTION OF THE DRAWINGS

The accompanying drawings, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments.

The methods and systems disclosed herein have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

FIG. 7 illustrates an example floor coordinate table that is obtained by conversion of the two-dimensional CAD drawing into Cartesian coordinates.

DETAILED DESCRIPTION

Figure 1:
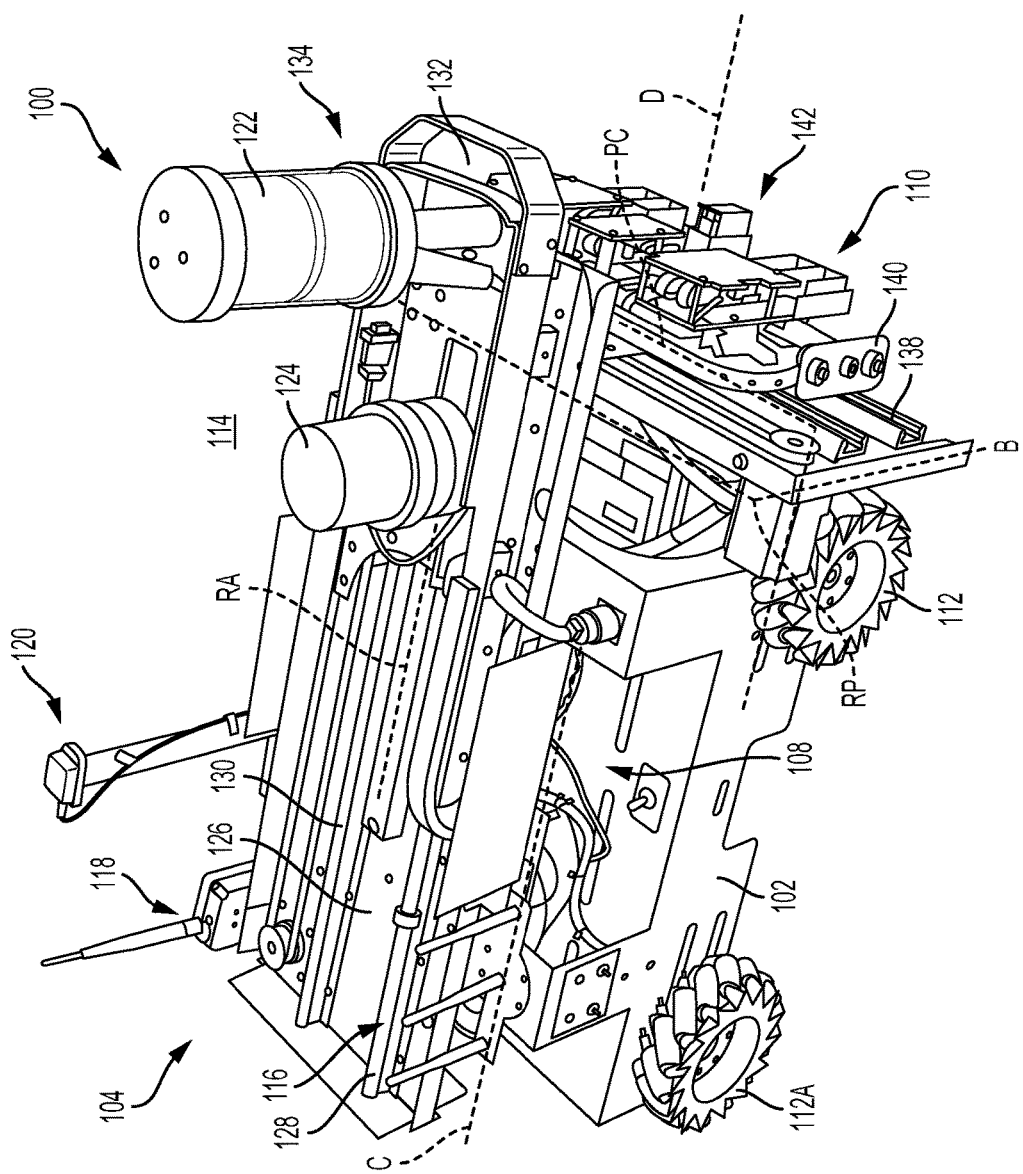
FIG. 1 is a perspective view of an example device of the present technology.

The present disclosure is now described more fully with reference to the accompanying drawings, in which example embodiments of the present disclosure are shown. The present disclosure may, however, be embodied in many different forms and should not be construed as necessarily being limited to the example embodiments set forth herein. Rather, these example embodiments are provided so that the disclosure is thorough and complete, and fully conveys the concepts of the present disclosure to those skilled in the art. Also, features described with respect to certain example embodiments may be combined in and/or with various other example embodiments. Different aspects and/or elements of example embodiments, as disclosed herein, may be combined in a similar manner. Further, at least some example embodiments may individually and/or collectively be components of a larger system, wherein other procedures may take precedence over and/or otherwise modify their application. Additionally, a number of steps may be required before, after, and/or concurrently with example embodiments, as disclosed herein. Note that any and/or all methods and/or processes, at least as disclosed herein, can be at least partially performed via at least one entity, at least as described herein, in any manner, irrespective of the at least one entity having any relationship to the subject matter of the present disclosure.

Generally, the present technology relates to devices and systems that transfer digital construction instructions onto a substrate such as a floor, wall, or other the like. Construction instructions can comprise, for example, two dimensional computer automated design (CAD) models, textual instructions, and aesthetic designs such as tile patterns and mosaic patterns—just to name a few.

An example device is configured to transfer the construction instructions to the substrate by physically marking the substrate. The example device can use location and motion sensing to translate itself along the substrate, such as a floor along a marking path defined from the CAD model.

In one embodiment, the device is provided with a control system that is configured to translate the device along the substrate in a direction of translation that corresponds with floor coordinates included in the construction instructions. To be sure, the floor coordinates include, in some embodiments, Cartesian coordinates that define where floor markings should be located. In one example, the floor markings and their corresponding floor coordinates include placement lines where sole plates of floors are positioned on the floor (in accordance with a CAD model).

The device is generally configured to communicate with a base station, such as a total station, which measures a distance between the device and the base station and outputs a current location back to the device. In some embodiments, the controller is configured to calculate the current location rather than the base station.

In some embodiments, the device comprises a translating rail platform and a prism or reflector that mounts to the translating rail platform. The prism is used to reflect signals back to the base station. The prism translates on the rail platform so that the prism can reflect signals at different positions along the path of the rail platform. This feature can be used to fine tune the current location of the device as will be described in greater detail infra.

The controller can compare the current location to the floor coordinates to determine if the device should be transferring a marking at that location or not.

The controller can also ensure that the marking assembly is correctly transferring floor markings by matching the current location of the device with the floor coordinates. Thus, the controller is continuously or substantially continuously receiving updates to its current location.

Using the current location information and the floor coordinates, the controller can selectively adjust the direction of translation of the device relative to the floor to steer the device along the floor coordinates. In some embodiments, a marking implement or device can also be moved to align with the floor coordinates. The movement of the marking implement can be in combination with or independent of the device itself (such as a chassis or frame).

In some embodiments, the device is configured with motion sensing devices such as gyroscopes, inertial measurement units (IMUs), accelerometers, and so forth, that are used to fine tune the current location and/or direction of translation of the device to ensure that the markings are transferred to the floor with high accuracy.

In some embodiments, the device includes a marking assembly that physically transfers the floor markings to the floor. Movement of the marking assembly can be independently controlled by the controller relative to the chassis to allow for accurate floor marking transference to the floor despite inconsistent positioning of the chassis relative to the floor coordinates. Thus, small deviations in chassis position relative to the floor coordinates can be compensated for by selective independent adjustment of the position of a marking device associated marking assembly.

Systems can comprise combinations of construction marking devices and base stations. These and other advantages of the present technology will be described in greater detail below with reference to the collective drawings.

Turning now to FIG. 1, an example device 100 is illustrated. The device 100 generally comprises a chassis 102, a rail platform 104, a controller 108, and a marking assembly 110. The device 100 can comprise additional or fewer components so long as such embodiments are consistent with the claimed technology.

In some embodiments, the chassis 102 provides a frame upon which other components of the device can be mounted. In one embodiment, the chassis 102 comprises four omni-directional wheels 112A-D, two of which (wheel 112A and wheel 112B) are illustrated in FIG. 1. Each of the wheels can be independently controlled by the controller 108 to translate in any direction along a floor 114. Selective and combined actuation of the wheels by the controller 108 allows the device 100 to translate in any direction including, forward, reverse, lateral (left and right), as well as diagonal.

As will be described in greater detail infra, the device 100 is caused to translate along a direction of translation D by the controller 108. For example, the controller 108 can communicate with actuators associated with the wheels to cause the wheels to rotate in a particular manner. To be sure, the direction of translation is equivalent to a direction in which the device 100 is moving.

The controller 108 causes the device 100 to move in the direction of translation D by ensuring that the current location of the device 100 corresponds to the floor coordinates. In FIG. 1, the direction of translation D is aligned with a centerline C of the device 100. Again, the direction of translation D can change depending upon the direction of movement of the device 100 such that lateral movement of the device 100 changes the direction of translation D to be perpendicular to the centerline C. Diagonal movement of the device 100 changes the direction of translation D to be a vector between purely lateral and purely longitudinal movement of the device 100.

The controller 108 is mounted to the chassis 102 and positioned (at least partially) below the rail platform 104. Power sources such as batteries can be disposed within the chassis 102.

Also mounted on the chassis 102 are one or more wireless antennas 116 that are part of the controller 108. A transceiver 118 is also mounted to the rail platform 104.

A motion sensing unit 120 is also mounted to the chassis 102 and can be used to fine tune movement of the device 100. Motion input generated by the motion sensing unit 120 can also be used to control movement of the marking assembly 110, independently (or in combination with) movement of the chassis 102.

An optical prism 122, which is also a component of the controller 108, is mounted to the rail platform 104. In some embodiments, the device 100 also comprises a warning indicator 124 that is mounted on the chassis 102, and in some embodiments on the rail platform 104.

In some embodiments, the rail platform 104 comprises a support plate 126 that is mounted to the chassis 102. The support plate 126 is provided with a pair of guide rails 128 and 130, which slidingly receive an upper plate 132 upon which the optical prism 122 is installed. The upper plate 132 translates along the rail platform 104 between an extended position 134A and a retracted position 134B (shown in phantom line).

The rail platform 104 includes, for example, a pulley system 136 that selectively moves the upper plate 132 between the extended and retracted positions. As will be discussed below, the upper plate 132 can transition between the extended and retracted positions during location sensing operations.

In some embodiments, the rail platform is configured to translate the optical prism along a rail axis RA between the retracted position and the extended position. To be sure, the optical prism 122 is mounted to the rail platform 104 and translates with movement of the rail platform 104, and specifically the upper plate 132.

The controller 108 effectuates the sliding movement of the rail platform 104 along the rail axis RA.

Turning now to FIGS. 1-4, the marking assembly 110 comprises a print rail 138 and a print rail carriage 140 mounted to the print rail 138 in such a way that the print rail carriage 140 can translate linearly along the print rail 138. In some embodiments, the print rail is mounted to the chassis on a print rail plane RP that is perpendicular to a chassis plane PC that is substantially parallel with the floor or substrate upon which the device 100 is operating.

Figure 4:
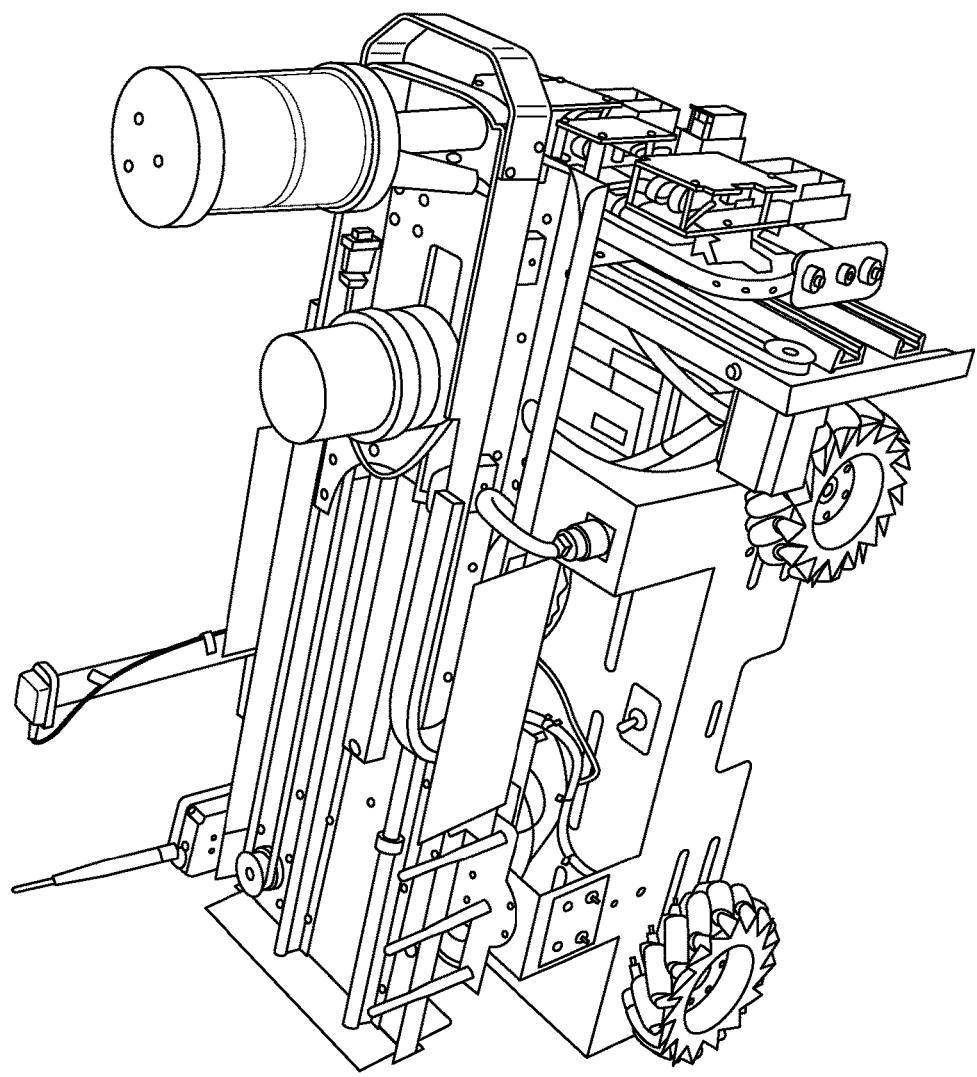
FIG. 4 is another perspective view of the device of FIG. 1 with a print carriage in a neutral position, similar to FIG. 1.

In some embodiments, the print rail carriage 140 is configured to translate laterally along the print rail plane RP from a leftmost position (FIG. 2) to a rightmost position (FIG. 3), and a neutral position (FIG. 4).

In some embodiments, the marking assembly 110 comprises a print head 142 mounted to the print rail carriage 140. As illustrated in FIG. 1, the print rail carriage 140 can comprise more than one print head 142. Each print head can include a unique color of ink. In another embodiment, each of the print heads includes the same color of ink.

The print head 142 can include graphite, chalk, powder, paint, an ink cartridge, a laser ink cartridge, an ink jet cartridge, or any other marking delivery device such as a laser or other etching device. The print head 142 is controlled by the controller 108 to dispense markings (or etchings) onto the floor, in accordance with the floor markings. For example, the floor markings could include a line having a particular thickness. The floor markings could include a solid line, dots, dashes, dash patterns, or other symbols. The floor markings are part of the construction instructions that are provided to the device 100. Thus, the device 100 is configured not only to determine if a mark is necessary at a given location in accordance with the floor coordinates, but also to determine what marking is appropriate at the given location.

Again, the marking assembly 110 can be actuated independently (or in combination) with the movement of the chassis 102, as needed.

Figure 5:
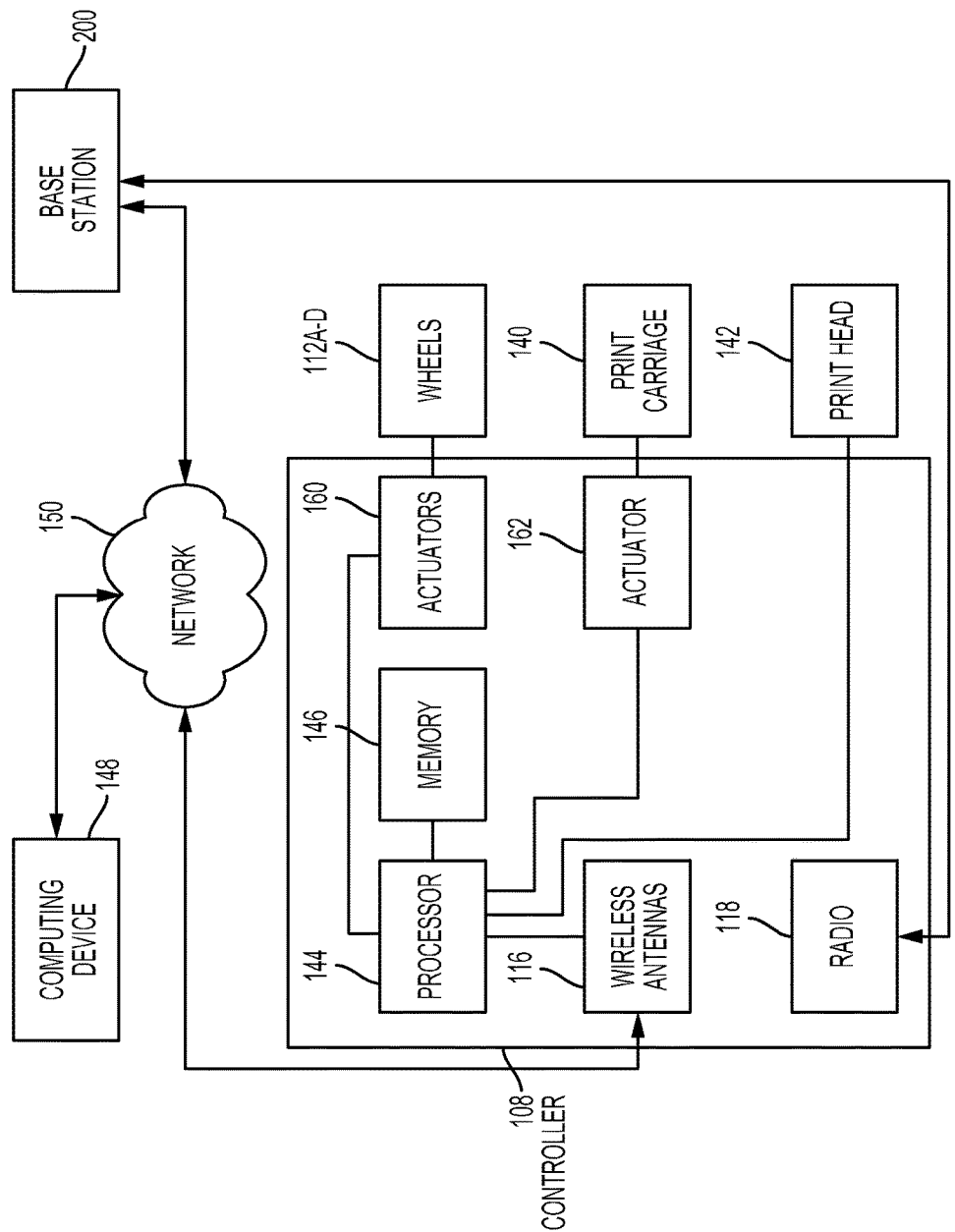
FIG. 5 is a schematic diagram of an example controller for use with the device of FIG. 1.

Turning now to FIG. 5, which is a schematic diagram of the controller 108. The controller 108 comprises a processor 144 and memory 146. The memory 146 comprises executable instructions that when executed by the processor 144 allows the processor 144 to control various components of the device 100.

For example, the processor 144 can control the rail platform 104, the marking assembly 110, the wheels 112A-D, the wireless antennas 116, and the transceiver 118.

According to some embodiments, the processor 144 is configured to receive construction instructions from a computing device 148. For example, construction instructions can include a two dimensional CAD drawing that comprises a framing layout for a building.

Construction instructions are received from the computing device 148 by the processor 144 using the wireless antennas 116. In some embodiments, the processor 144 uses the wireless antennas 116 to connect to a network 150, such as a WiFi network. Other example networks include, but are not limited to a local intranet, a PAN (Personal Area Network), a LAN (Local Area Network), a WAN (Wide Area Network), a MAN (Metropolitan Area Network), a virtual private network (VPN), a storage area network (SAN), a frame relay connection, an Advanced Intelligent Network (AIN) connection, a synchronous optical network (SONET) connection, a digital T1, T3, E1 or E3 line, Digital Data Service (DDS) connection, DSL (Digital Subscriber Line) connection, an Ethernet connection, an ISDN (Integrated Services Digital Network) line, a dial-up port such as a V.90, V.34 or V.34bis analog modem connection, a cable modem, an ATM (Asynchronous Transfer Mode) connection, or an FDDI (Fiber Distributed Data Interface) or CDDI (Copper Distributed Data Interface) connection. Furthermore, communications may also include links to any of a variety of wireless networks, including WAP (Wireless Application Protocol), GPRS (General Packet Radio Service), GSM (Global System for Mobile Communication), CDMA (Code Division Multiple Access) or TDMA (Time Division Multiple Access), cellular phone networks, GPS (Global Positioning System), CDPD (cellular digital packet data), RIM (Research in Motion, Limited) duplex paging network, Bluetooth radio, or an IEEE 802.11-based radio frequency network.

Figure 6:
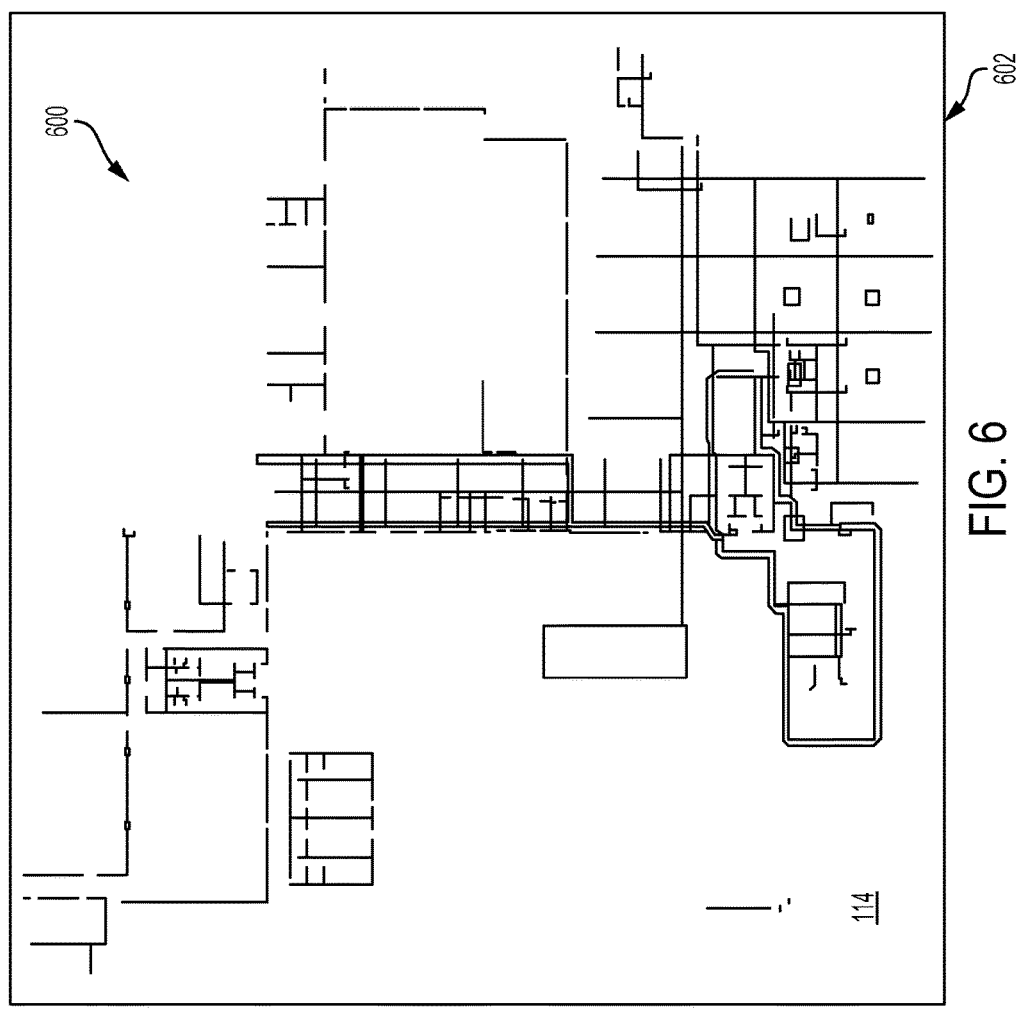
FIG. 6 illustrates example construction instructions that include a two-dimensional CAD drawing.

In some embodiments, the device 100 and the computing device 148 communicate with one another over the network 150 so that the processor 144 receives the construction instructions. Again, the construction instructions comprise the floor markings defined by floor coordinates. An example set of floor markings and coordinates are illustrated in FIGS. 6 and 7. In this example, a two dimensional CAD model 600 is utilized as illustrated in FIG. 6. The CAD model 600 includes the floor markings 602 that require transferring to the floor 114. The CAD model 600 is converted to flooring coordinates 700 that are provided in a table format as in FIG. 7.

The flooring coordinates 700 include the exact locations where physical markings should and should not be made on the floor 114 by the device 100.

Table 1 below illustrates an example arc test. The arc test includes settings for the device 100 at a plurality of waypoints. At each of these waypoints, X and Y start positions are determined. Also, a forward or reverse direction of travel is selected. In this embodiment, the device can include two scribing instruments or pens. The test instructions delineate whether the pens are on or off, per each waypoint. Also, a distance between the pin heads can be selected. To be sure, not only can the chassis of the device translate, but the pen heads can also move independently or in combination with the chassis. For example, if the chassis is stable, the pen heads can be moved relative to one another as the device translated to transfer an arc design onto the substrate.

TABLE 1

|  | X Start | Y Start | Forward/ Reverse | Penhead 1 on/off | Distance Between Pen Heads | Penhead 2 on/off | X Arc | Y Arc |
| --- | --- | --- | --- | --- | --- | --- | --- | --- |
| Waypoint 1 | 1009.35184 | 5010.32667 | 0 | 1 | 0.5 | 1 | 1004 | 5006.08 |
| Waypoint 2 | 999.3992 | 5011.91023 | 1 | 1 | 0.5 | 1 | | |
| Waypoint 3 | 999.71697 | 5013.96073 | 1 | 1 | 0.5 | 1 | 1006 | 5018.19 |

TABLE 1-continued

|  | X Start | Y Start | Forward/ Reverse | Penhead 1 on/off | Distance Between Pen Heads | Penhead 2 on/off | X Arc | Y Arc |
|---|---|---|---|---|---|---|---|---|
| Waypoint 4 | 1009.68303 | 5012.36736 | 1 | 1 | 0.5 | 1 | | |
| Waypoint 5 | 999.71697 | 5013.96073 | 1 | 1 | 0.5 | 1 | | |

Once the CAD model is received into memory 146, the processor 144 begins to align itself with the floor coordinates included in the CAD model. In some embodiments, the CAD model is converted to floor coordinates and floor marking instructions.

Turning now to FIGS. 1 and 7-9 collectively, to align the device 100 with the floor coordinates, the processor 144 receives current location information from a base station 200. The base station 200 is configured to output signals that are reflected by the optical prism 122 on the device 100. The base station 200 receives these reflected signals and determines a distance and/or location of the device 100 relative to the base station 200. The base station 200 can be positioned in a particular location on the floor at a position relative to the floor coordinates. The base station 200 determines the current location for the device 100 and provides the current location to the processor 144. In some embodiments, the base station 200 can couple with the controller 108 over the network 150 or alternatively (or in addition to), the base station 200 can communicate with the controller 108 over a wireless connection established through the transceiver 118 (also referred to as a radio).

To be sure, in some embodiments, the device 100 may communicate with a plurality of base stations positioned around the floor, such as when the floor area is large.

As mentioned previously, the device 100 can update its current location continuously or in accordance with a schedule. The more often the current location is updated, the more accurately the controller 108 can keep the device 100 in alignment with the flooring coordinates.

The processor 144 uses the current location information and the flooring coordinates to align itself for marking of the floor.

Figure 8:
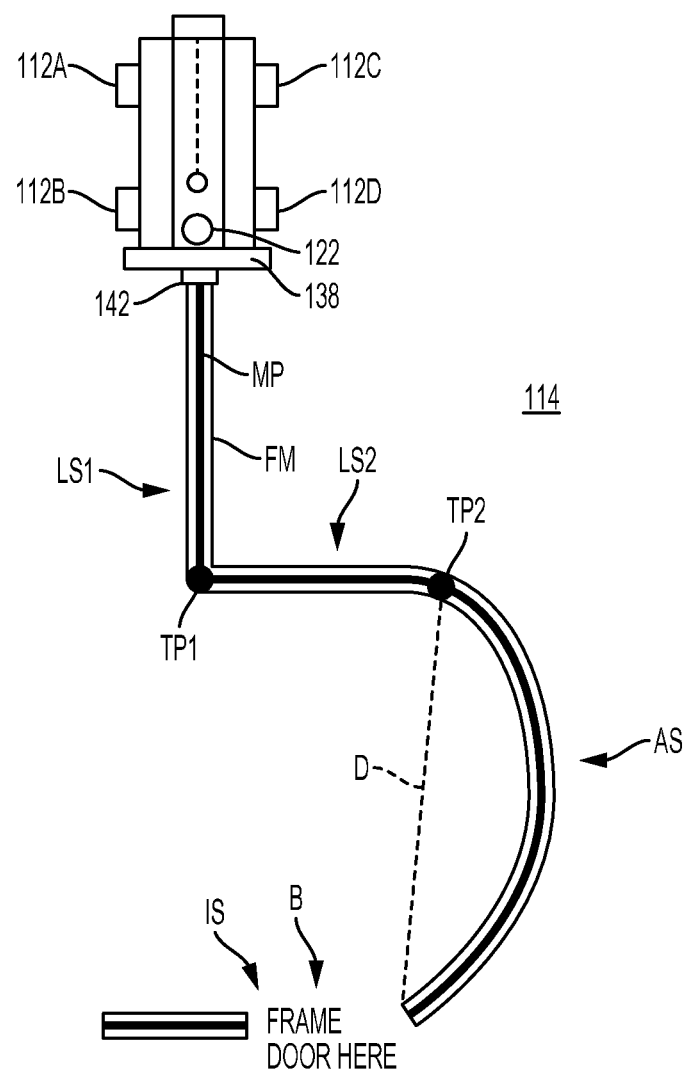
FIG. 8 is a schematic diagram of the device traversing a marking path defined by floor coordinates, as well as physical markings applied along the marking path.
Figure 9:
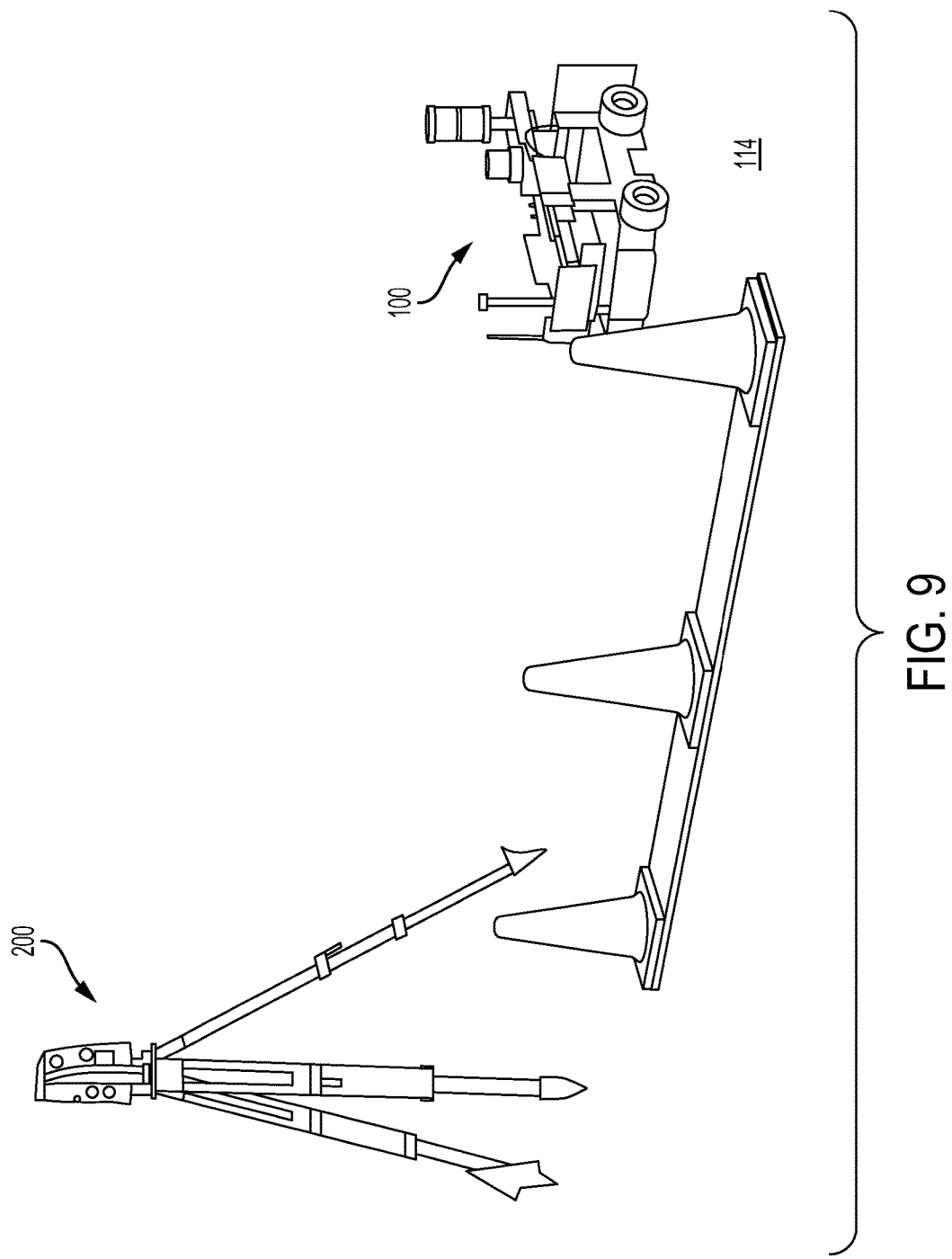
FIG. 9 is a perspective view of an example system that comprises the device of FIG. 1 as well as a base station.

As illustrated in FIGS. 5 and 8 collectively, in some embodiments, the flooring coordinates define a marking path MP that corresponds to each point on the floor where a marking is required. That is, each point along the marking path MP will receive a marking in order to transfer the floor markings onto the floor 114.

In one embodiment, the processor 144 aligns a centerline C of the chassis 102 with the marking path MP, which in turn aligns the marking device with the marking path MP (assuming the marking device is aligned with the centerline C).

The processor 144 aligns the chassis 102 with the marking path MP by selectively controlling the operation of wheels 112A-D through individual actuators 160 associated with each of the wheels 112A-D.

In another embodiment, a current location of the marking device (such as the print head 142) is aligned with the marking path MP by selectively and laterally translating the print head 142 across the print rail 138 using the print rail carriage 140. Thus, the centerline C of the chassis 102 need not be aligned with the marking path MP, but only the marking device (print head 142).

Thus, even when the chassis 102 is slightly misaligned with the marking path MP, the processor 144 can independently and laterally adjust the placement of the print head 142 to ensure that the print head 142 is aligned with the marking path MP. Minor defects in the floor or slight errors in wheel operation can cause the chassis 102 to deviate from the marking path MP. These deviations can be overcome with the independent movement of the print head 142.

The processor 144 can control the movement of the print head 142 using actuator 162, which can comprise an electric motor that translates the print rail carriage 140.

According to some embodiments, the motion sensing unit 120 provides the processor 144 with near real time motion and/or directional-based feedback that allows the processor 144 to determine that a slight misalignment with the marking path MP has occurred. To compensate for the misalignment, the processor 144 actuates lateral movement of the print head 142 to compensate such that the markings created by the print head 142 are in alignment with the marking path MP. For example, the motion sensing unit 120 may sense that the chassis is moving slightly to the left or right. If the marking path MP is straight, the processor 144 determines that the chassis 102 is drifting out of alignment and causes the actuators associated with the print rail carriage 140 to align the print head 142 with the marking path MP by translating the print rail carriage 140 a compensating distance. The required distance is proportional to (or at least related to) the degree of misalignment between the chassis 102 and the marking path MP.

Deviations in chassis alignment can be rectified by the processor 144 actuating the wheels 112A-D to bring the chassis 102 in alignment with the marking path MP as current location information is updated.

The construction instructions can comprise transition points along the marking path MP, such as transition points TP1 and TP2. A transition point can comprise a location at which the marking path MP deviates from a linear section LS1 to a second linear section LS2 (or any other section) at an angle. For example, LS1 transitions to LS2 at a 90-degree angle, which is common with an interior wall corner. When a current location of the device 100 corresponds to a transition point, the device 100 will stop movement and execute a transition sequence.

In some embodiments, a transition sequence includes the processor 144 moving the optical prism 122 to a first position (which could be the extended or retracted position) along the rail platform 104. The current location of the device 100 is obtained from the base station. Next, the processor 144 translates the optical prism 122 to a second position, which is located a distance away from the first position, along the rail platform 104. The second position could be the extended or retracted position, or any position therebetween.

The current location of the device 100 is obtained from the base station. These two current location measurements are used to realign the device 100 and reorient the chassis 102 in alignment with the second linear section LS2 of the marking path MP.

The transition sequence can be used to reorient the chassis 102 along any portion of the marking path MP where an angle is encountered.

In some embodiments, the processor 144 can cooperatively use the translation of the chassis 102 along a direction of translation with lateral movement of the print head 142 to produce an arcuate marking. For example, in arcuate section AS, the chassis 102 is translated in a linear direction of translation D, while the print head 142 is gradually moved linearly to the rightmost position and back to centerline C to produce a semi-circle marking.

To be sure, any arcuate and/or angular marking can be applied to the floor using a combination of chassis 102 translation and print head 142 translation by the processor 144. Again, the chassis can translate longitudinally, laterally, and/or diagonally as a combination of both lateral and longitudinal movement, as allowed by the omni-directional movement of the wheels 112A-D.

Again, the marking path MP is defined by the floor markings included in the construction instructions. By example, the marking path MP can include sections such as blank section B where no physical markings are placed by the device 100. These blank sections could include, for example, a space for an interior door or other opening. The sections LS1, LS2, and AS correspond, in one embodiment, to an outer periphery of a frame wall that will be installed.

The processor 144 can cause the print head 142 to scribe instructions onto the substrate, such as instructions IS that informs framing crews to "Frame Door Here". Other words, drawings, designs and combinations thereof can be printed onto the substrate by the device.

The processor 144 can cause the print head 142 to actuate and transfer floor markings to the floor 114 using, for example, a driver, such as a printer driver that is installed into memory 146. The driver is usable by the processor 144 to control the print head 142 to print floor markings FM along the marking path MP in accordance with the floor coordinates.

Referring now to FIGS. 10-13, another example device 300 is illustrated. The device 300 is constructed similarly to the device 100 of FIGS. 1-9, with the exception that the device 300 includes a longitudinally extendable print carriage assembly 302.

Figure 10:
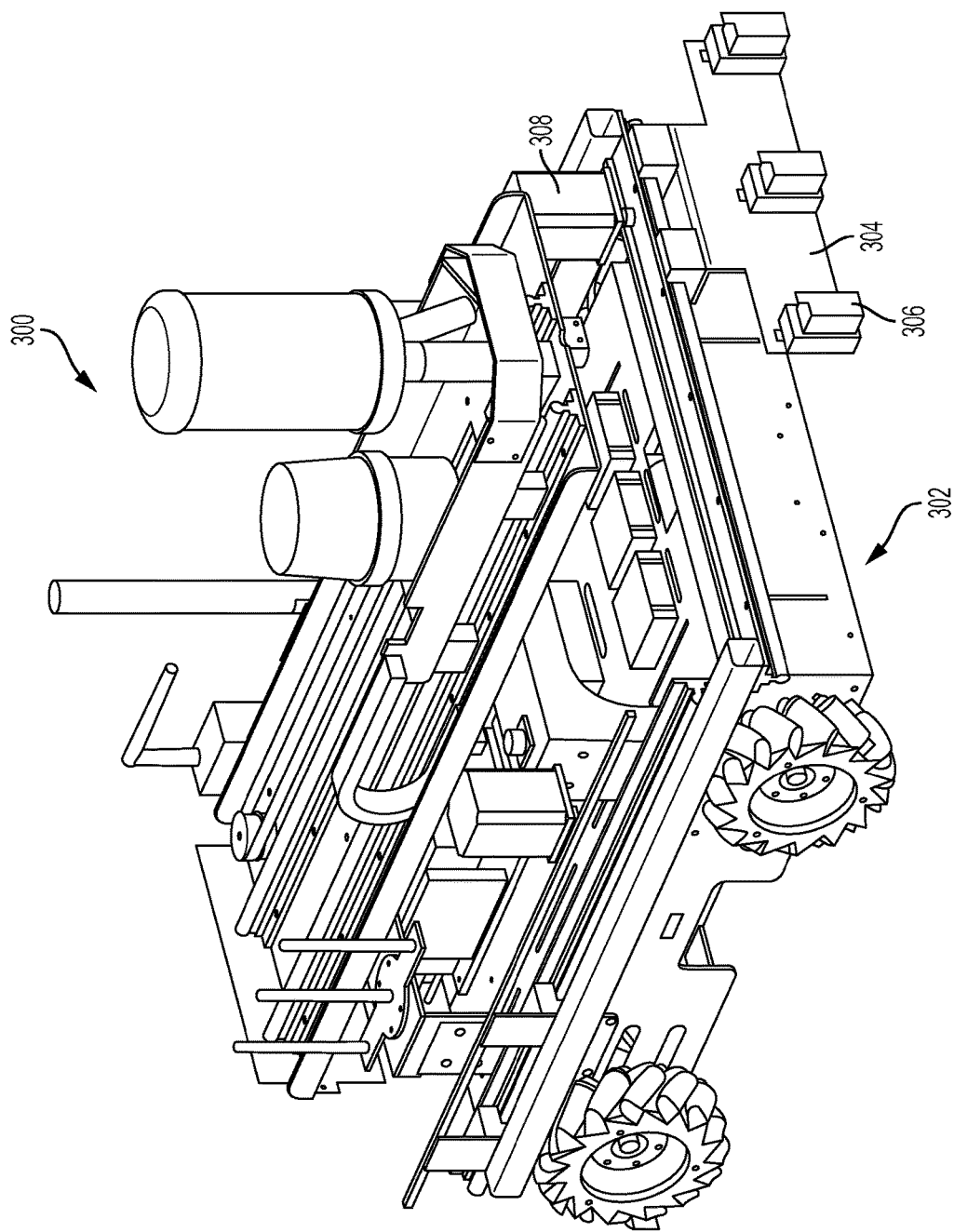
FIGS. 10-13 collectively illustrate another example device that comprises a longitudinally extending print chassis assembly.
Figure 11:
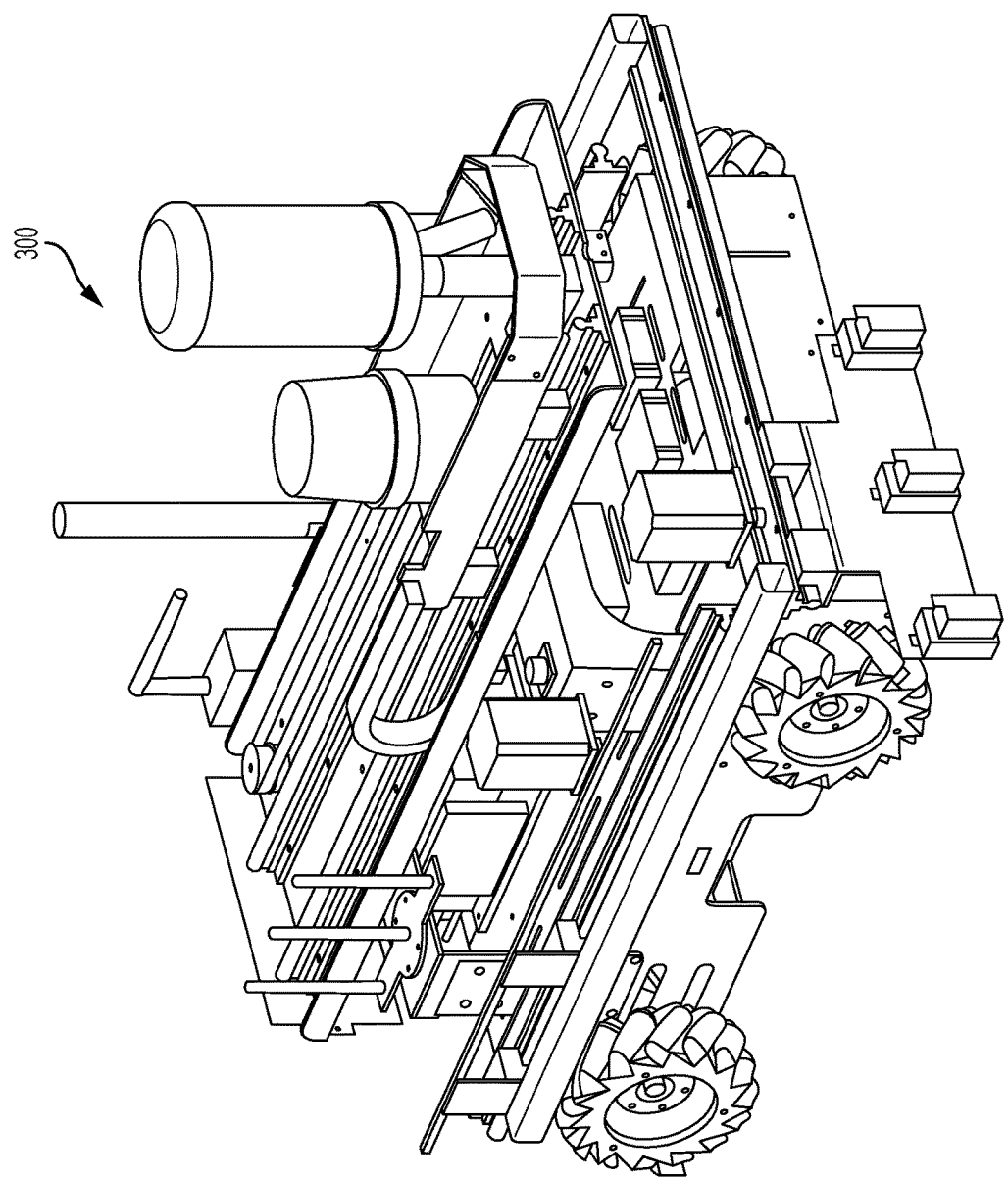
Figure 12:
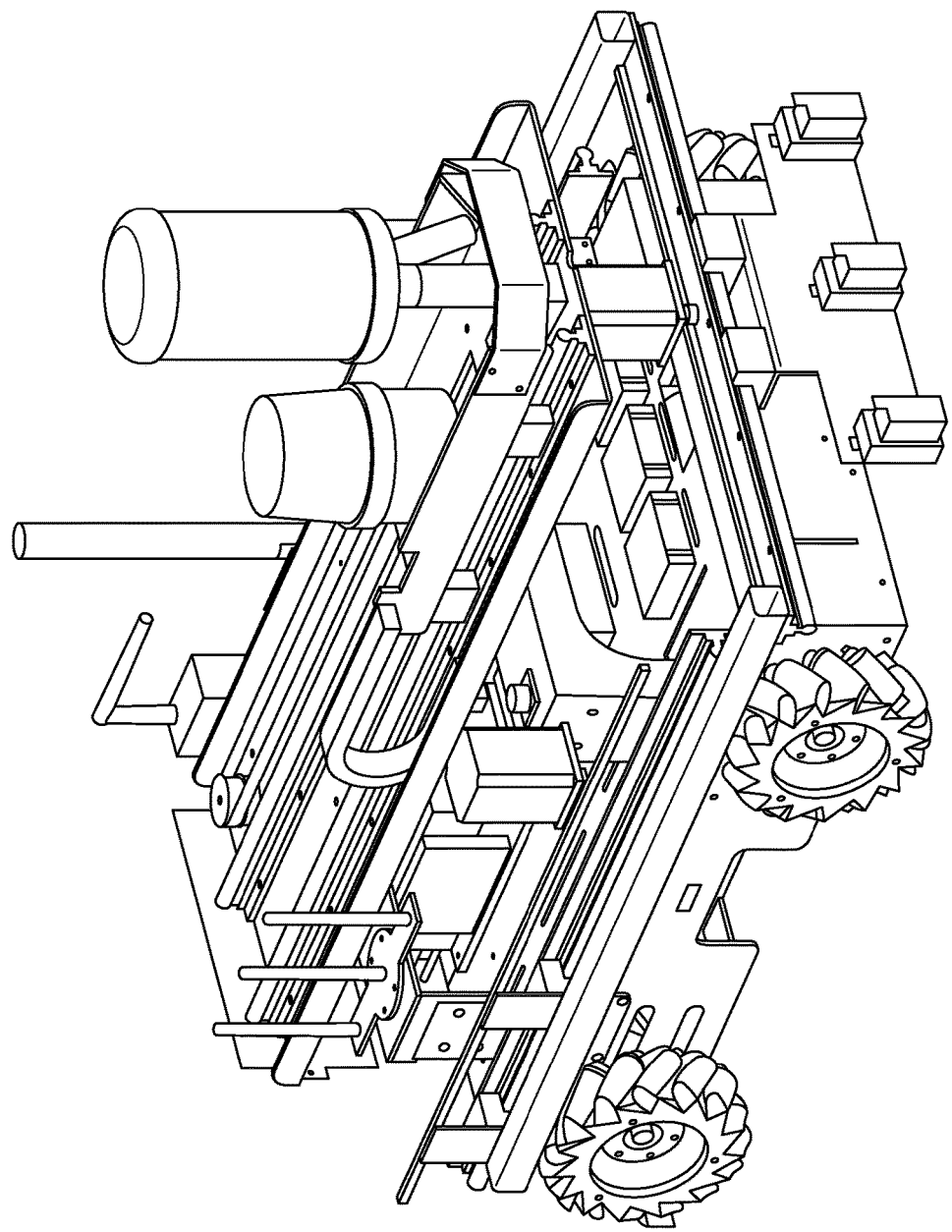

The carriage assembly 302 is configured to operate to laterally translate a print carriage 304 and any associated print heads 306. The processor of the device 300 is configured to control a motor 308 (or other actuator) to move the print carriage 304 laterally. A leftmost position is illustrated in FIG. 10. A rightmost position is illustrated in FIG. 12. A neutral position is illustrated in FIG. 12.

The motor 308 can cause the print carriage 304 to translate along a track 310. The print carriage 304 is coupled to the track 310 using two track brackets 312 and 314.

Figure 13:
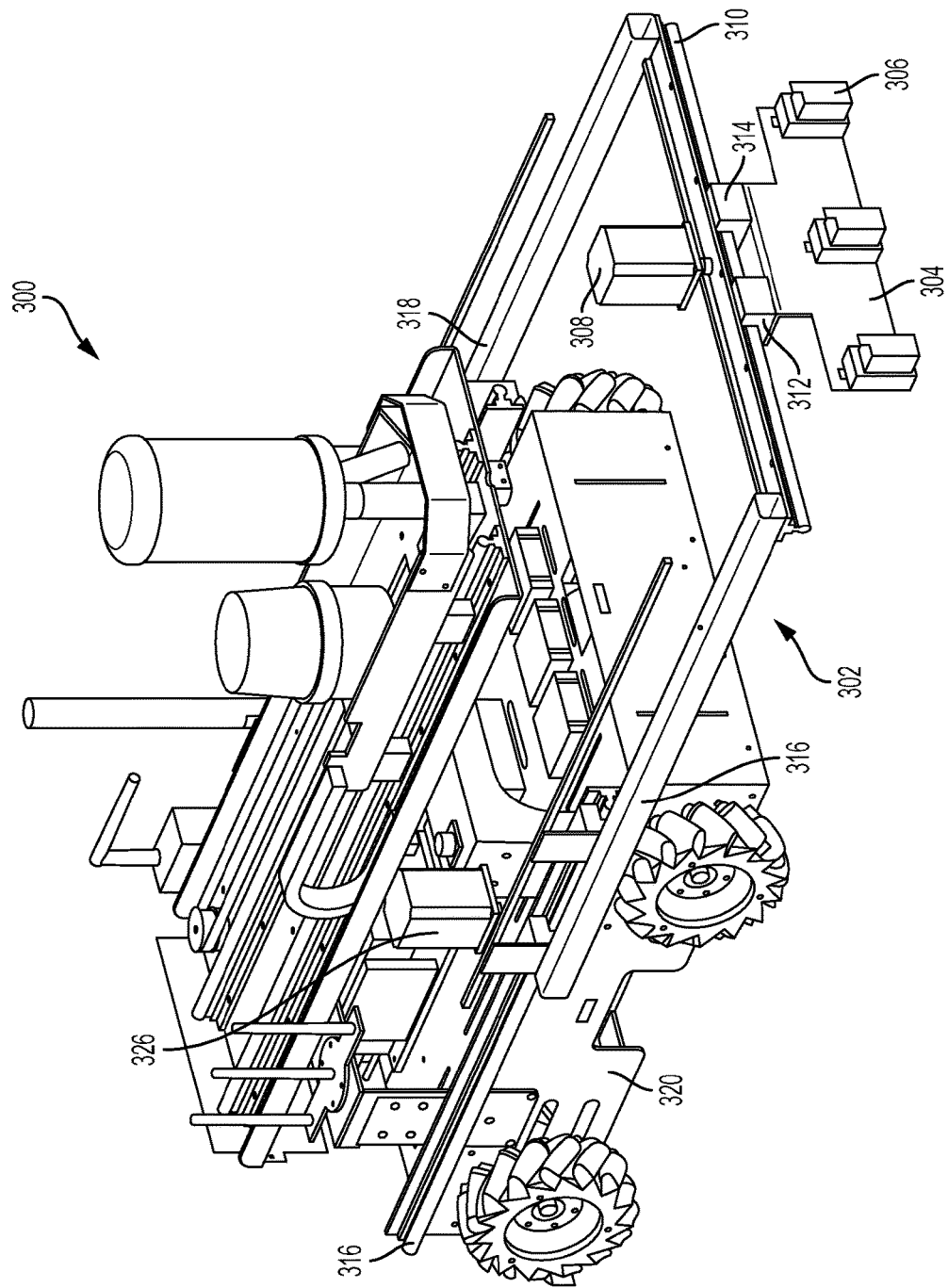

As illustrated in FIG. 13, in some embodiments, the carriage assembly 302 comprises a pair of armatures 316 and 318 that are disposed on opposing sides of the chassis 320. In some embodiments, the armatures (only armature 316 being illustrated) slidingly engage with tracks 322 and 324 on the chassis 320.

The armatures can extend and retract using actuators, such as motor 326.

Figure 2:
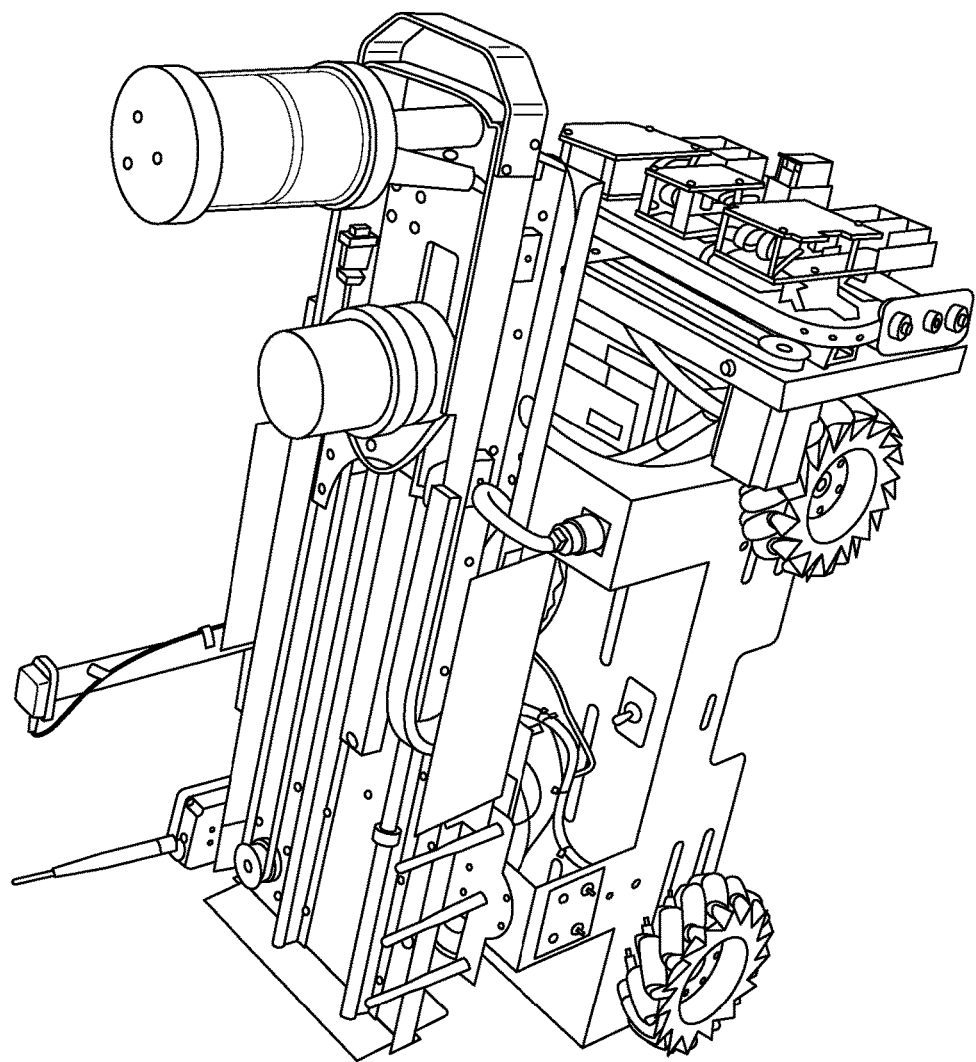
FIG. 2 is another perspective view of the device of FIG. 1 with a print carriage in a leftmost position.
Figure 3:
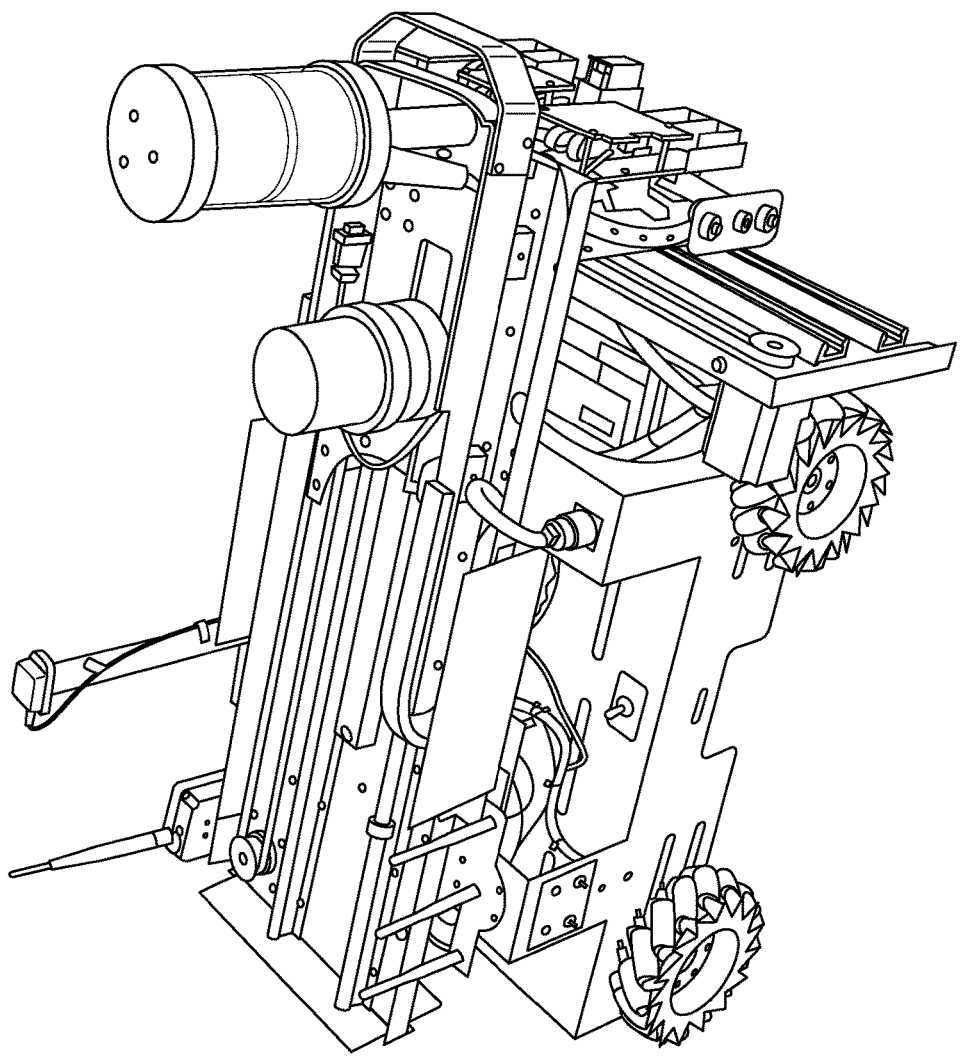
FIG. 3 is another perspective view of the device of FIG. 1 with a print carriage in a rightmost position.

Advantageously, the controller of the device 300, which is similar to the controller 108 of FIG. 2, is configured to selective translate (extend and retract) the print carriage 304 as needed. For example, if the device 300 is stuck in a particular location and cannot move forward or backwards, the controller can extend or retract the print carriage 304 as necessary to allow the print head 306 to reach a desired area and transfer floor markings.

To be sure, while the present disclosure, in some embodiments uses terminology such as floor, ground, substrate, and so forth, the devices of the present technology can be utilized on any horizontal surface.

Figure 14:
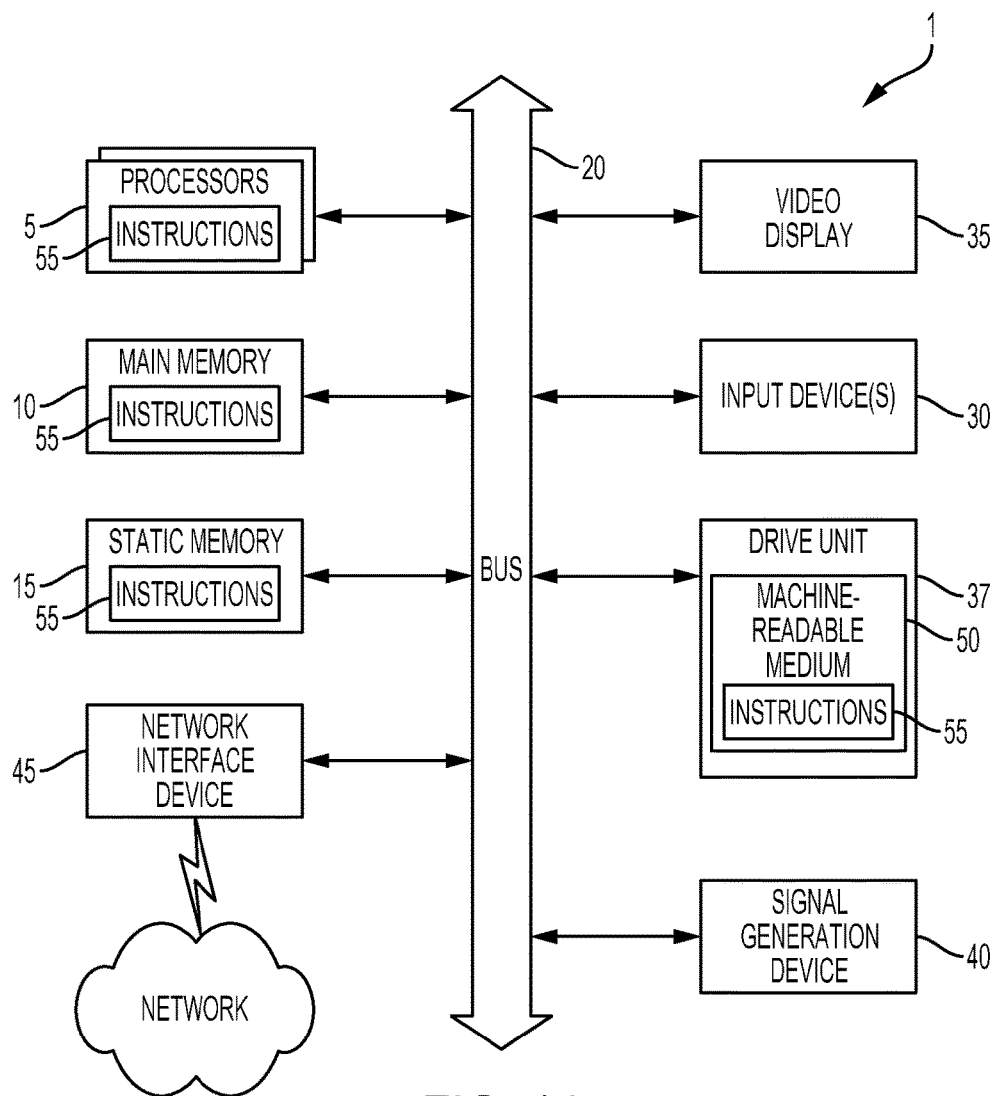
FIG. 14 is an example computing device that can be used to implement embodiments of the present technology.

FIG. 14 is a diagrammatic representation of an example machine in the form of a computer system 1, within which a set of instructions for causing the machine to perform any one or more of the methodologies discussed herein may be executed. In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a robotic construction marking device, a base station, a personal computer (PC), a tablet PC, a set-top box (STB), a personal digital assistant (PDA), a cellular telephone, a portable music player (e.g., a portable hard drive audio device such as an Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1 includes a processor or multiple processors 5 (e.g., a central processing unit (CPU), a graphics processing unit (GPU), or both), and a main memory 10 and static memory 15, which communicate with each other via a bus 20. The computer system 1 may further include a video display 35 (e.g., a liquid crystal display (LCD)). The computer system 1 may also include an alphanumeric input device(s) 30 (e.g., a keyboard), a cursor control device (e.g., a mouse), a voice recognition or biometric verification unit (not shown), a drive unit 37 (also referred to as disk drive unit), a signal generation device 40 (e.g., a speaker), and a network interface device 45. The computer system 1 may further include a data encryption module (not shown) to encrypt data.

The disk drive unit 37 includes a computer or machine-readable medium 50 on which is stored one or more sets of instructions and data structures (e.g., instructions 55) embodying or utilizing any one or more of the methodologies or functions described herein. The instructions 55 may also reside, completely or at least partially, within the main memory 10 and/or within the processors 5 during execution thereof by the computer system 1. The main memory 10 and the processors 5 may also constitute machine-readable media.

The instructions 55 may further be transmitted or received over a network via the network interface device 45 utilizing any one of a number of well-known transfer protocols (e.g., Hyper Text Transfer Protocol (HTTP)). While the machine-readable medium 50 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like. The example embodiments described herein may be implemented in an operating environment comprising software installed on a computer, in hardware, or in a combination of software and hardware.

Not all components of the computer system 1 are required and thus portions of the computer system 1 can be removed if not needed, such as I/O devices.

One skilled in the art will recognize that the Internet service may be configured to provide Internet access to one or more computing devices that are coupled to the Internet service, and that the computing devices may include one or more processors, buses, memory devices, display devices, input/output devices, and the like. Furthermore, those skilled in the art may appreciate that the Internet service may be coupled to one or more databases, repositories, servers, and the like, which may be utilized in order to implement any of the embodiments of the disclosure as described herein.

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the present technology in the form disclosed. Many modifications and variations will be apparent to those of ordinary skill in the art without departing from the scope and spirit of the present technology. Exemplary embodiments were chosen and described in order to best explain the principles of the present technology and its practical application, and to enable others of ordinary skill in the art to understand the present technology for various embodiments with various modifications as are suited to the particular use contemplated.

Aspects of the present technology are described above with reference to flowchart illustrations and/or block diagrams of methods, apparatus (systems) and computer program products according to embodiments of the present technology. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present technology. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

Also, some embodiments may be described in terms of "means for" performing a task or set of tasks. It will be understood that a "means for" may be expressed herein in terms of a structure, such as a processor, a memory, an I/O device such as a camera, or combinations thereof. Alternatively, the "means for" may include an algorithm that is descriptive of a function or method step, while in yet other embodiments the "means for" is expressed in terms of a mathematical formula, prose, or as a flow chart or signal diagram.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is noted at the outset that the terms "coupled," "connected", "connecting," "electrically connected," etc., are used interchangeably herein to generally refer to the condition of being electrically/electronically connected. Similarly, a first entity is considered to be in "communication" with a second entity (or entities) when the first entity electrically sends and/or receives (whether through wireline or wireless means) information signals (whether containing data information or non-data/control information) to the second entity regardless of the type (analog or digital) of those signals. It is further noted that various figures (including component diagrams) shown and discussed herein are for illustrative purpose only, and are not drawn to scale.

If any disclosures are incorporated herein by reference and such incorporated disclosures conflict in part and/or in whole with the present disclosure, then to the extent of conflict, and/or broader disclosure, and/or broader definition of terms, the present disclosure controls. If such incorporated disclosures conflict in part and/or in whole with one another, then to the extent of conflict, the later-dated disclosure controls.

The terminology used herein can imply direct or indirect, full or partial, temporary or permanent, immediate or delayed, synchronous or asynchronous, action or inaction. For example, when an element is referred to as being "on," "connected" or "coupled" to another element, then the element can be directly on, connected or coupled to the other element and/or intervening elements may be present, including indirect and/or direct variants. In contrast, when an element is referred to as being "directly connected" or "directly coupled" to another element, there are no intervening elements present.

Although the terms first, second, etc. may be used herein to describe various elements, components, regions, layers and/or sections, these elements, components, regions, layers and/or sections should not necessarily be limited by such terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be necessarily limiting of the disclosure. As used herein, the singular forms "a," "an" and "the" are intended to include the plural forms as well, unless the context clearly indicates otherwise. The terms "comprises," "includes" and/or "comprising," "including" when used in this specification, specify the presence of stated features, integers, steps, operations, elements, and/or components, but do not preclude the presence or addition of one or more other features, integers, steps, operations, elements, components, and/or groups thereof.

Example embodiments of the present disclosure are described herein with reference to illustrations of idealized embodiments (and intermediate structures) of the present disclosure. As such, variations from the shapes of the illustrations as a result, for example, of manufacturing techniques and/or tolerances, are to be expected. Thus, the example embodiments of the present disclosure should not be construed as necessarily limited to the particular shapes of regions illustrated herein, but are to include deviations in shapes that result, for example, from manufacturing.

Any and/or all elements, as disclosed herein, can be formed from a same, structurally continuous piece, such as being unitary, and/or be separately manufactured and/or connected, such as being an assembly and/or modules. Any and/or all elements, as disclosed herein, can be manufactured via any manufacturing processes, whether additive manufacturing, subtractive manufacturing and/or other any other types of manufacturing. For example, some manufacturing processes include three dimensional (3D) printing, laser cutting, computer numerical control (CNC) routing, milling, pressing, stamping, vacuum forming, hydroforming, injection molding, lithography and/or others.

Any and/or all elements, as disclosed herein, can include, whether partially and/or fully, a solid, including a metal, a mineral, a ceramic, an amorphous solid, such as glass, a glass ceramic, an organic solid, such as wood and/or a polymer, such as rubber, a composite material, a semiconductor, a nano-material, a biomaterial and/or any combinations thereof. Any and/or all elements, as disclosed herein, can include, whether partially and/or fully, a coating, including an informational coating, such as ink, an adhesive coating, a melt-adhesive coating, such as vacuum seal and/or heat seal, a release coating, such as tape liner, a low surface energy coating, an optical coating, such as for tint, color, hue, saturation, tone, shade, transparency, translucency, non-transparency, luminescence, anti-reflection and/or holographic, a photo-sensitive coating, an electronic and/or thermal property coating, such as for passivity, insulation, resistance or conduction, a magnetic coating, a water-resistant and/or waterproof coating, a scent coating and/or any combinations thereof.

Unless otherwise defined, all terms (including technical and scientific terms) used herein have the same meaning as commonly understood by one of ordinary skill in the art to which this disclosure belongs. The terms, such as those defined in commonly used dictionaries, should be interpreted as having a meaning that is consistent with their meaning in the context of the relevant art and should not be interpreted in an idealized and/or overly formal sense unless expressly so defined herein.

Furthermore, relative terms such as "below," "lower," "above," and "upper" may be used herein to describe one element's relationship to another element as illustrated in the accompanying drawings. Such relative terms are intended to encompass different orientations of illustrated technologies in addition to the orientation depicted in the accompanying drawings. For example, if a device in the accompanying drawings is turned over, then the elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the example terms "below" and "lower" can, therefore, encompass both an orientation of above and below.

While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A device, comprising:
   a chassis configured to translate along a floor;
   an optical prism mounted to the chassis that reflects signals from a base station;
   a marking assembly mounted to the chassis, the marking assembly comprising:
     a print rail mounted to the chassis;
     a print rail carriage mounted to the print rail, the print rail carriage configured to translate linearly along the print rail; and
     a print head mounted to the print rail carriage, the print head configured to apply a floor marking to the floor;
   a controller configured to:
     receive construction instructions comprising floor coordinates that define where floor markings should be applied to the floor;
     automatically translate the chassis along the floor in alignment with the floor coordinates, using current location information received from the base station;
     automatically translate the print rail carriage along the print rail, independent of the translation of the chassis, in alignment with the floor coordinates, using the current location information received from the base station; and
     automatically transfer the floor markings to the floor during translation of the chassis using the marking assembly in combination with movement of the chassis; and
   a motion sensor configured to determine movement of the chassis and provide the determined movement of the chassis to the controller as motion input to fine tune a current location and/or direction of translation of the chassis along the floor.

2. The device according to claim 1, wherein the chassis comprises omni-directional wheels for translating the device along the floor in an omni-directional manner.

3. The device according to claim 1, further comprising a wired or wireless module for receiving the construction instructions from a computing device.

4. The device according to claim 1, wherein the optical prism reflects signals from the base station, the controller receiving distance measurement signals from the base station that indicate a current location of the device.

5. The device according to claim 1, further comprising a rail platform disposed on the chassis, the rail platform configured to translate the optical prism along a rail axis between a retracted position and an extended position, the optical prism mounted to the rail platform and translating with movement of the rail platform.

6. The device according to claim 5, wherein the controller is further configured to translate the rail platform between the retracted position and the extended position when the device reaches a transition point on the construction instructions.

7. The device according to claim 6, wherein the controller is further configured to:
   obtain a first distance measurement signal from the base station when the rail platform is in the retracted position and a second distance measurement signal from the base station when the rail platform is in the extended position; and
   calculate a current location of the device using the first and second distance measurement signals.

8. The device according to claim 7, wherein the controller is further configured to:
   compare the current location to the floor coordinates; and
   adjust a direction of translation of the device if the comparison indicates a change in the direction of translation is required.

9. The device according to claim 1, wherein the print rail is mounted to the chassis on a print rail plane that is perpendicular to a chassis plane, the chassis plane being parallel with the floor.

10. The device according to claim 9, wherein the print rail carriage is configured to translate laterally along the print rail plane from a first end to a second end of the print rail.

11. The device according to claim 10, wherein in response to the construction instructions comprising a curved marking, the controller is further configured to:
   translate the print rail carriage laterally along the print rail plane during linear translation of the chassis to transfer the curved marking to the floor.

12. The device according to claim 1, wherein the marking assembly comprises one or more printer cartridges.

13. The device of claim 1, wherein the construction instructions comprise at least one CAD model.

14. The device of claim 1, wherein the construction instructions further comprise at least one transition point along a marking path.

15. The device of claim 1, wherein the motion sensor is further configured determine movement of the print rail carriage and provide input to the controller, to control movement of the print rail carriage independent of movement of the chassis.

16. The device of claim 1, wherein the print head is aligned with a marking path prior to transferring the floor markings to the floor, independent of a centerline of the chassis.

17. The device of claim 1, wherein the print head produces etch marks on the floor.

18. The device of claim 9, wherein the print rail carriage is further configured to translate laterally along the print rail plane between a leftmost position and a rightmost position.

19. The device of claim 1, wherein the floor coordinates are defined by Cartesian coordinates.

* * * * *